US010895618B2

(12) United States Patent
Fuhrmann et al.

(10) Patent No.: US 10,895,618 B2
(45) Date of Patent: Jan. 19, 2021

(54) METHOD FOR DETERMINING PROPER FUNCTIONING OF AN ANALYTIC SYSTEM AND CONTROL COMPOSITION FOR PERFORMING SAID METHOD

(71) Applicant: numares AG, Regensburg (DE)

(72) Inventors: Markus Fuhrmann, Maxhuette-Haidhof (DE); Maximilian Zucker, Munich (DE)

(73) Assignee: numares AG, Regensburg (DE)

( * ) Notice: Subject to any disclaimer, the term of this patent is extended or adjusted under 35 U.S.C. 154(b) by 0 days.

(21) Appl. No.: 16/342,021

(22) PCT Filed: Dec. 22, 2017

(86) PCT No.: PCT/EP2017/084440
§ 371 (c)(1),
(2) Date: Apr. 15, 2019

(87) PCT Pub. No.: WO2018/115470
PCT Pub. Date: Jun. 28, 2018

(65) Prior Publication Data
US 2019/0250230 A1    Aug. 15, 2019

(30) Foreign Application Priority Data
Dec. 22, 2016  (DE) .......... 10 2016 226 066

(51) Int. Cl.
*G01R 33/46*   (2006.01)
*G01R 33/465*  (2006.01)
*H01J 49/00*   (2006.01)

(52) U.S. Cl.
CPC ......... *G01R 33/4625* (2013.01); *G01R 33/46* (2013.01); *G01R 33/465* (2013.01); *H01J 49/0009* (2013.01)

(58) Field of Classification Search
USPC ........................................ 324/309
See application file for complete search history.

(56) References Cited

U.S. PATENT DOCUMENTS

| 2004/0098208 | A1* | 5/2004 | Reeve | G01N 24/08 |
| | | | | 702/32 |
| 2005/0222504 | A1* | 10/2005 | Otvos | G01R 33/307 |
| | | | | 600/410 |
| 2007/0264677 | A1* | 11/2007 | Otvos | G01N 24/08 |
| | | | | 435/11 |

FOREIGN PATENT DOCUMENTS

| WO | 2012045773 A9 | 4/2012 |
| WO | 2016038190 A1 | 3/2016 |

OTHER PUBLICATIONS

Bull et al., "Dextran as a Plasma Substitute", The Lancet, 1949, p. 134-143.
Jupin, et al., "NMR identification of endogenous metabolites interacting with fatted and non-fatted human serum albumin in blood plasma: Fatty acids influence the HSA-metabolite interaction", Journal of Magnetic Resonance, vol. 228, 2013, p. 81-94.
Malz, et al., "Validation of quantitative NMR", Journal of Pharmaceutical and Biomedical Analysis, vol. 38, 2005, p. 813-823.
Wu, et al., "NMR analysis of the CSF and plasma metabolome of rigorously matched amyotrophic lateral sclerosis, Parkinson's disease and control subjects", Metabolomics, 2016, vol. 12:101, p. 1-13.

* cited by examiner

*Primary Examiner* — Rodney E Fuller
(74) *Attorney, Agent, or Firm* — The Webb Law Firm

(57) ABSTRACT

A method for determining proper functioning of an analytic system includes: a) measuring a control composition with an analytic system, the functioning of which is to be determined, to obtain a control result; b) analyzing the control result for predefined test criteria; and c) determining the functioning of the analytic system based on the analysis of step b). The control result includes signals distributed over a whole result space that equals a result space of the analytic system resulting from a measurement of a sample on the analytic system.

20 Claims, No Drawings

METHOD FOR DETERMINING PROPER FUNCTIONING OF AN ANALYTIC SYSTEM AND CONTROL COMPOSITION FOR PERFORMING SAID METHOD

CROSS-REFERENCE TO RELATED APPLICATIONS

This application is the United States national phase of International Application No. PCT/EP2017/084440 filed Dec. 22, 2017, and claims priority to German Patent Application No. 10 2016 226 066.9 filed Dec. 22, 2016, the disclosure of each of which is hereby incorporated by reference in its entirety.

BACKGROUND OF THE INVENTION

Field of the Invention

The disclosure relates to method for determining proper functioning of an analytic system and to a control composition to be used in such a method.

Technical Considerations

Modern analytic technologies provide a huge number of individual data resulting from a single analysis of a sample. This data can then be subjected to an almost unlimited number of possible tests. Thereby, it is important that on the one hand the analytic test is accurate and reliable (so-called analytic performance) and on the other hand that the results of the analytic test allow correct conclusions, e.g., regarding the corresponding disease or the health status of an individual (so-called clinical or diagnostic performance).

The analytic performance and the clinical or diagnostic performance are strongly dependent on the quality of the acquired data. Therefore, it is necessary to guarantee that an analytic system used for providing the according data is functioning correctly and is generally able to provide reliable data.

WO 2016/038190 A1 discloses a method for extracting information encoded in the result of an NMR measurement. This international patent application also addresses the problem that the general validity of the performed NMR measurements needs to be assured. In this respect, it discloses a general concept of obtaining a set of calibration, control and sample results to ensure that the sample results are measured with a high accuracy. However, no details regarding the realization of control measurements are disclosed.

SUMMARY OF THE INVENTION

It is an object underlying the proposed solution to provide methods for determining whether or not an analytic system is correctly functioning. In addition, a control composition shall be provided that can be used in such a method for many different applications.

This object is achieved by a method for determining proper functioning of an analytic system having the subsequently explained steps.

In a first step, a control composition is measured with an analytic system, wherein the functioning of this analytic system is to be determined by the instant method. By performing this measuring, a control result is obtained.

The control result is afterwards analyzed with respect to its compliance with at least one predefined test criterion, in particular with at least two predefined test criteria. Expressed in other words, a predefined test criterion is applied to the control result in order to check whether or not the control result fulfils this test criterion. If it fulfils the test criterion or the test criteria, the test is successfully passed.

This analytic step serves afterwards as basis for the determination of the functioning of the analytic system. If the test or the tests on the control result have been successfully passed to a predefined extent, the analytic system functions proper.

According to the solution, the control result comprises signals that are distributed over a result space. Thereby, the result space equals the full or complete result space resulting from a measurement of a sample on the analytic system. Thus, the control result is not an individual measuring result of single substances or of a plurality of substances showing certain signals in an according measuring result, but rather covers the whole analytic space that is also used for a subsequent measurement of a sample on the same analytic system. Expressed in other words, the control result is particularly suited to determine the proper functioning of the tested analytic system since it enables a user not only to check certain sections of the result space of a measuring result of a sample to be tested on the same analytic system, but rather enables the user to draw a conclusion regarding the functioning of the analytic system on the basis of the whole relevant result space of the analytic system.

The result space can have one dimension (like a spectral range in case of a spectrum), two dimensions (like a spectral range combined with intensities in case of a spectrum) or more than two dimensions (e.g., three or four dimensions). Typically, it has one dimension or two dimensions.

The result obtained on an analytic system can be generally used to draw different independent diagnostic conclusions. This is also possible after the according measurement has been done, without performing another measurement. Thus, if a result is present, signals that have not been used for the original analysis of the result, but that are required for a different test, can be subsequently quantified. If a specific control substance would be necessary for each different analysis, such an approach would not be possible. The instantly claimed method enables a user to test the accuracy, reliability and overall proper functioning of the analytic system, regardless of the analytic evaluations of the obtained measuring results that are to be done afterwards. Thus, the instantly claimed method is a broadly applicable method that is not limited to evaluating the functioning of an analytic system with respect to specific analyses.

The analytic system the proper functioning of which is to be tested by the instantly claimed method can be generally any analytic system. For example, a sequencer used for next-generation sequencing (NGS) in genomics, a mass spectrometer, e.g., used in proteomics or an NMR spectrometer, e.g., used in metabolomics is a suited analytic system. In an embodiment, the analytic system comprises or essentially consists of an NMR spectrometer. The control result is then an NMR result, such as an NMR spectrum. In such a case, the result space would be a spectral range, optionally combined with an according intensity range on an intensity scale as further dimension.

In case of a mass spectrometer used as an analytic system or as a part of an analytic system, the result space would equally be a spectral range, optionally combined with an according intensity range on an intensity scale as further dimension. In other applications, the result space can, e.g., be a retention time range (e.g., in case of a chromatography system such as an HPLC system as analytic system or as part of the analytic system), optionally combined with an according intensity range on an intensity scale as further dimension, or an image if any kind of imaging system is used as analytic system or as part of the analytic system. Thereby, the image can be represented by an area or a volume and by pixels or voxels of different colors, different color intensities, or different brightness. In any case, it should be noted that not a single section of the obtained control result, but always the whole result space of the obtained control result is used for analyzing the control result for its compliance with the predefined test criteria.

In an embodiment, the control result comprises at least two result space sections that are separate from each other. Thereby, at least one signal is present in each of the result space sections. Thus, it is possible to divide the result space into different sub-spaces or sub-ranges of the whole result space. If the control result is an NMR spectrum, then the result space would be the whole spectral range considered (e.g., 0 ppm to 10 ppm). Then, a first result section could encompass the spectral range of 0.5 to 2 ppm and a second result space section could encompass the spectral range of 5 to 7 ppm. If the control result is a list of signals observed by the analysis performed on the analytic system, such subdivision into distinct result space sections could be performed likewise. The number of different result space sections is not limited per se. To give an example, 2, 3, 4, 5, 6, 7, 8, 9, or 10 result space sections are particularly suited to be used when dividing the result space into different sections.

The size of the individual result space sections (like a spectral range in case of a spectrum as result) can be adjusted in dependence on the specific analysis method used for obtaining the control result as well as on the basis of the control composition.

The control composition as well as a sample to be measured on the same analytic system are usually measured in form of a solution. The used solvent to prepare this solution generally causes also signals in the control result. In an embodiment, at least one of the result space sections is located on a first side of such solvent signal, wherein the remaining result space sections are located on a second side of the same solvent signal. The individual sides can also be referred to as first result space side and second result space side. In this embodiment, the solvent signal is surrounded by different result space sections, but does not contribute to such a result space section. In doing so, signals that were not caused by the control sample itself can be excluded from evaluation. This enhances the overall reliability of the results obtained with the instant method since solvent signals often have a lower accuracy than control signals or sample signals because the used detector often is over-saturated by such solvent signals.

In case of NMR spectrometry as analytic method applied by the analytic system, a typical solvent signal is a water signal or one or more signals caused by organic solvents such as toluene. Toluene exhibits several solvent signals in an NMR spectrum. In such a case, the individual result space sections could be located on either side of these toluene signals (or other solvent signals). By dividing the control result into different result space sections and by locating them on both sides of the observed solvent signals, one can assure that relevant control signals to be evaluated within the framework of the claimed method are located on each side of the observed solvent signals and are thus well distributed over the relevant result space.

In an embodiment, care is taken that at least one of the result space sections, in particular all of the result space sections, is located such that it does not encompass any solvent signals. In this embodiment, no solvent signals at all are used for determining the functioning of the analytic system.

In an embodiment, the predefined test criterion is chosen from the group consisting of signal position, signal form, signal width, signal intensity, signal integral, and distance to another signal. The signal symmetry is a suited signal form to be tested. The distance to another signal might be the distance to an adjacent signal or the distance to a distant signal. It is possible to determine the functioning of the analytic system on the basis of a single or of only two of these test criteria. However, in another embodiment, three, four, five, or all six test criteria are applied to the control result. This means that some of the individual signals observed in the control result are tested for, e.g., one or two test criteria and other signals of the control result are tested, e.g., for the same or another or other two test criteria. It is possible to choose six individual signals and test them for compliance with six different of the before-mansion test criteria. It is also possible to choose a number of signals and test their compliance with a number of test criteria, wherein at least some of the test criteria are applied to different signals. Generally, an expectation value is defined for compliance of a specific signal with the applied test criterion. If the expectation value is met by the analyzed signal of the control result (e.g., within a predefined deviation range that is considered to be acceptable), the according test criterion is met by the analyzed signal.

In case of NMR spectrometry as analytic method applied by the analytic system, the signal form like the signal symmetry is indicative for the temperature stability of the analytic system, the correct adjustment of shim parameters and the absence of vibrations during measurement. The distance to another signal might in such a case be a distance between two NMR lines of a doublet. The distance between these two lines is indicative for the temperature stability and the type of the used NMR spectrometer. The NMR signal position is indicative for the pH value of the measured control composition. Thus, the signal position can be used to check the pH value of the subsequently measured sample and to detect any deviations of the pH value from the according expectation value.

The signal intensity can be used to check the detection limit in case of a substance being in very low concentration in the control composition.

In an embodiment, the control composition comprises a matrix and control substances dissolved in the matrix. Thereby, the matrix is chosen such that it is at least 80% identical to a sample that is subsequently to be measured on the analytic system. Thereby, the identity relates to the overall physical properties of the matrix. Thus, when taken all physical properties together, the matrix resembles the sample to extent of at least 80%, in particular at least 85%, in particular at least 90%, in particular at least 95%, in particular at least 97%, in particular at least 98%, in particular at least 99% and very particular 100%. In an embodiment, the overall physical properties of the matrix are identical to the overall physical properties of the sample to an extent of between 80% and 100% or any other range that can be built up from the before-mentioned individual values, e.g., 85% to 99%, 90% to 97%, or 95% to 100%.

In an embodiment, the overall physical properties of the matrix are defined by at least one property chosen from the group consisting of viscosity, conductivity, osmotic concentration, ionic strength, maximum concentration of individual matrix constituents, and distribution of result space signals of individual matrix constituents. Thus, it is possible to define the overall physical properties of the matrix by a single of the before-mentioned properties or by a combination of any of these properties.

By focusing on specific matrix properties it is possible to define the overall physical matrix properties such that they resemble the same overall physical properties of the sample to an extent that allows using the control composition for checking the overall functioning or integrity of the analytic system specifically adapted to the sample. Thus, specific test criteria can be applied that are particularly important for a proper analysis of the sample that is subsequently to be measured on the analytic system.

In an embodiment, the step of analyzing the control sample for compliance with at least one specific test criterion is performed by at least one, in particular by all, of the subsequently explained sub-steps.

According to a first sub-step, the general spectral quality is checked by analyzing at least one signal quality criterion. Thereby, this signal quality criterion is chosen from the group consisting of signal position, signal form, signal width, signal intensity, signal integral, and distance to another signal. The signal form to be checked can be, in an embodiment, the signal symmetry. As already explained above, this "checking" process can be performed such that expectation value is defined for the signal quality criterion. Afterwards, a deviation of a specific signal from the predefined expectation value is determined. If this deviation lies within a predefined acceptable deviation range, the signal is considered to fulfil the specific signal quality criterion and the sub-step is successfully passed.

According to a second sub-step, the linearity of the result space is checked by evaluating signals of defined test substances being present in the control composition with respect to their observed signal intensities and/or signal integrals and/or parameters derived therefrom and their deviations from according expectation values. These expectation values can also be referred to as predefined target signal intensities and/or target signal integrals and/or parameters derived from the target signal intensities and/or the target signal integrals. If the deviations lie within a predefined acceptable deviation range, the linearity of the result space is considered to be given and the sub-step is successfully passed. The evaluation of the linearity of the result space can also be referred to as an evaluation of the dynamic range of the result space.

According to a third sub-step, selected signals of the result space are quantified and the result of this quantification is compared with a known target value. In case that the quantification result meets the known target value (expectation value) within a predefined acceptable deviation range, the compliance of the selected signal with its expectation value is assumed and the sub-step is successfully passed. The evaluation of obtained quantification results can also be referred to as evaluation of the trueness of the analytic system.

The quality of the obtained signals, such as the spectral quality of the obtained signals in case of the control result being a control spectrum, the linearity of the analytic system as well as the trueness of the analytic system are examples of properties by which the overall functioning of the analytic system can be defined.

In an embodiment, thresholds of maximum deviation from expectation values are defined in any of the precedingly explained sub-steps, wherein the thresholds must not be exceeded in order to successfully pass the respective sub-step.

In an embodiment, the maximum deviation from an ideal fitting curve of measuring values in dependence on a parameter causing a change of the measuring values can be predefined in absolute or relative terms. Thereby, as many single signals as desired can be defined as analytic criterion. To give an example, it could be defined that at most 50%, in particular at most 40%, in particular at most 30%, in particular at most 20%, in particular at most 10% of all signals are to be allowed to deviate more than 25% each, in particular more than 20% each, in particular more than 15% each, in particular more than 10% each, in particular more than 5% in each from the respective reference value of the ideal fitting curve. In an embodiment, the ideal fitting curve is a straight line connecting values representing signal intensities or signal integrals (parameters derived therefrom) versus substance concentration. Such a straight line is particularly suited when evaluating the linearity of the analytic system.

In an embodiment, the method comprises the step of determining whether or not a predefined minimum sensitivity value of the analytic system is achieved. This is done by trying to detect a signal of a low-concentrated constituent of the control composition. If the detection is successful, the desired minimum sensitivity value of the analytic system is achieved. If no signal of the low-concentrated constituent of the control composition can be detected, the minimum sensitivity value of the analytic system is worse than the desired value so that the according test step is not passed by the tested analytic system.

In an embodiment, the result of the determination of the functioning of the analytic system is presented to the user or the test person of the analytic system. This can be done, e.g., by preparing a test report and by outputting it to the respective user. The test report can encompass the single results of the individual tests performed on the different signals in the control result. Alternatively, it is also possible that the test report only indicates the final result, i.e., whether or not the analytic system functions proper. Thereby, "proper functioning" of the analytic system is assumed if a predefined number of performed tests, in particular all of the performed tests, has been successfully passed.

In an aspect, the solution also relates to a control composition that can be used for a method according to the preceding explanations. Thereby, the control composition comprises a matrix and control substances dissolved in the matrix. According to the solution, the matrix comprises sodium chloride, deuterium oxide, a buffering agent and a preservative agent. In addition, a dextran like dextran-40 (i.e., a dextran with a molecular weight of 40 kDa) can be present in the matrix. Other suited dextrans are dextrans having a molecular weight between 20 kDa and 80 kDa, in particular between 30 kDa and 70 kDa, in particular between 40 kDa and 60 kDa, in particular between 35 kDa and 55 kDa. The sodium chloride can be part of the used buffer system (such as a phosphate-buffered saline).

The matrix without dextran is particularly suited to emulate urine since its overall physical properties are highly similar to that of urine. Thus, if a urine sample is to be analyzed on the analytic system, a control composition with such a matrix is particularly suited.

If a dextran, in particular dextran-40, is present in the matrix, the according control composition is particularly suited to emulate a blood serum sample. This is due to the fact that, because of the additional presence of dextran in the matrix, the overall physical properties of the control composition strongly resemble the overall physical properties of a blood serum sample.

Benzoic acid, methyl paraben, ethyl paraben, propyl paraben, butyl paraben and sodium azide are suited preservatives, wherein propyl paraben is particularly suited. A sodium phosphate is a suited buffering agent.

In an embodiment, the matrix additionally comprises at least one further substance that is chosen from the group consisting of urea, a bisulfite, a sorbate and a coloring agent. Sodium bisulfite or potassium bisulfite are suited bisulfites. Potassium sorbate or calcium sorbate are suited sorbates. If a phosphate buffer is used, calcium sorbate is preferably not being used in order to avoid precipitation of calcium phosphate. Bromophenol blue, bromothymol blue and bromocresol purple are suited coloring agents.

In an embodiment, the control composition, in particular the control composition for urine samples, is free of urea. The omission of urea can have positive effects on the stability of other substances in the control composition.

In an embodiment, the control substance is chosen from the group consisting of an acetate, a citrate, sucrose, methanol, maleic acid, a propanol, a formate, ethylene glycol, a pyrazine, trimethylsilylpropanoic acid, histidine, and combinations thereof.

Sodium citrate, magnesium citrate, calcium citrate, potassium citrate, copper citrate, silver citrate, and combinations thereof are suited citrates. If a phosphate buffer is used, calcium citrate is preferably not being used in order to avoid precipitation of calcium phosphate. If an azide is used, copper citrate and/or silver citrate are preferably not being used as citrates.

Sodium acetate, potassium acetate, calcium acetate, ammonium acetate, and combinations thereof are suited acetates. If a phosphate buffer is used, calcium acetate is preferably not being used in order to avoid precipitation of calcium phosphate.

Both 2-propanol (isopropanol) and 1-propanol can be used as propanol, wherein 2-propanol is particularly suited.

Ethyl formate, sodium formate, methyl formate, methyl chloroformate, triethyl orthoformate, trimethyl orthoformate, and combinations thereof are suited formates. Methyl chloroformate, triethyl orthoformate, and trimethyl orthoformate are rather unstable in water so that ethyl formate, sodium formate, and methyl formate are particularly suited formates.

Non-substituted pyrazine (1,4-diazine) and alkylated pyrazines such as dimethyl pyrazine are suited pyrazines.

In an embodiment, the chosen control substances comprise an acetate, methanol, maleic acid, propanol, a formate, a pyrazine, trimethylsilylpropanoic acid, and histidine. In an embodiment, the control substances consist of these compounds.

A particularly suited control composition comprises the following ingredients in the indicated concentration ranges. In an embodiment, the control composition consists of these ingredients.

| Ingredient | Concentration in a control composition for blood serum samples | Concentration in a control composition for urine samples |
|---|---|---|
| Acetate (in particular sodium acetate) | 1 mM to 100 mM, in particular 2 mM to 90 mM, in particular 3 mM to 80 mM, in particular 4 mM to 70 mM, in particular 5 mM to 60 mM, in particular 6 mM to 50 mM, in particular 7 mM to 40 mM, in particular 8 mM to 30 mM, in particular 9 mM to 20 mM, in particular 10 mM to 15 mM | 1 mM to 100 mM, in particular 2 mM to 90 mM, in particular 3 mM to 80 mM, in particular 4 mM to 70 mM, in particular 5 mM to 60 mM, in particular 6 mM to 50 mM, in particular 7 mM to 40 mM, in particular 8 mM to 30 mM, in particular 9 mM to 20 mM, in particular 10 mM to 15 mM |
| Maleic acid (in particular in form of its sodium salt) | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM |
| Lactate (in particular sodium lactate) | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM | none |
| Trimethylsilylpropanoic acid (TSP) | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM | 0.01 mM to 10 mM, in particular 0.05 mM to 9 mM, in particular 0.1 mM to 8 mM, in particular 0.2 mM to 7 mM, in particular 0.3 mM to 6 mM, in particular 0.4 mM to 5 mM, in particular 0.5 mM to 4 mM, in particular 0.6 mM to 3 mM, in particular 0.7 mM to 2 mM, in particular 0.8 mM to 1 mM |
| Pyrazine | 0.01 mM to 10 mM, in particular 0.05 mM to 9 mM, | 0.01 mM to 10 mM, in particular 0.05 mM to 9 mM, |

-continued

| Ingredient | Concentration in a control composition for blood serum samples | Concentration in a control composition for urine samples |
|---|---|---|
| | in particular 0.1 mM to 8 mM, in particular 0.2 mM to 7 mM, in particular 0.3 mM to 6 mM, in particular 0.4 mM to 5 mM, in particular 0.5 mM to 4 mM, in particular 0.6 mM to 3 mM, in particular 0.7 mM to 2 mM, in particular 0.8 mM to 1 mM | in particular 0.1 mM to 8 mM, in particular 0.2 mM to 7 mM, in particular 0.3 mM to 6 mM, in particular 0.4 mM to 5 mM, in particular 0.5 mM to 4 mM, in particular 0.6 mM to 3 mM, in particular 0.7 mM to 2 mM, in particular 0.8 mM to 1 mM |
| 2-propanol | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM |
| Methanol | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM |
| Formate (in particular sodium formate) | 0.001 mM to 1 mM, in particular 0.005 mM to 0.9 mM, in particular 0.01 mM to 0.8 mM, in particular 0.02 mM to 0.7 mM, in particular 0.03 mM to 0.6 mM, in particular 0.04 mM to 0.5 mM, in particular 0.05 mM to 0.4 mM, in particular 0.06 mM to 0.3 mM, in particular 0.07 mM to 0.2 mM, in particular 0.08 mM to 0.1 mM | 0.01 mM to 10 mM, in particular 0.05 mM to 9 mM, in particular 0.1 mM to 8 mM, in particular 0.2 mM to 7 mM, in particular 0.3 mM to 6 mM, in particular 0.4 mM to 5 mM, in particular 0.5 mM to 4 mM, in particular 0.6 mM to 3 mM, in particular 0.7 mM to 2 mM, in particular 0.8 mM to 1 mM |
| L-histidine | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM | 0.1 mM to 100 mM, in particular 1 mM to 90 mM, in particular 2 mM to 80 mM, in particular 3 mM to 70 mM, in particular 4 mM to 60 mM, in particular 5 mM to 50 mM, in particular 6 mM to 40 mM, in particular 7 mM to 30 mM, in particular 8 mM to 20 mM, in particular 9 mM to 10 mM |
| An azide (in particular sodium azide); optional ingredient | 0% or 0.001% to 0.1%, in particular 0.005% to 0.09%, in particular 0.01% to 0.08%, in particular 0.02% to 0.07%, in particular 0.03% to 0.06%, in particular 0.04% to 0.05% All percentages are weight per volume (w/v) percentages. | 0% or 0.001% to 0.1%, in particular 0.005% to 0.09%, in particular 0.01% to 0.08%, in particular 0.02% to 0.07%, in particular 0.03% to 0.06%, in particular 0.04% to 0.05% All percentages are weight per volume (w/v) percentages. |
| A benzoate (in particular sodium benzoate); optional ingredient | 0 mM or 0.01 mM to 10 mM, in particular 0.05 mM to 9 mM, in particular 0.1 mM to 8 mM, in particular 0.2 mM to 7 mM, in particular 0.3 mM to 6 mM, in particular 0.4 mM to 5 mM, in particular 0.5 mM to 4 mM, in particular 0.6 mM to 3 mM, in particular 0.7 mM to 2 mM, in particular 0.8 mM to 1 mM | 0 mM or 0.01 mM to 10 mM, in particular 0.05 mM to 9 mM, in particular 0.1 mM to 8 mM, in particular 0.2 mM to 7 mM, in particular 0.3 mM to 6 mM, in particular 0.4 mM to 5 mM, in particular 0.5 mM to 4 mM, in particular 0.6 mM to 3 mM, in particular 0.7 mM to 2 mM, in particular 0.8 mM to 1 mM |
| A bisulfite (in particular sodium bisulfite); optional ingredient | 0 mg/l or 1 mg/l to 100 mg/l, in particular 5 mg/l to 90 mg/l, in particular 10 mg/l to 80 mg/l, in particular 15 mg/l to | 0 mg/l or 1 mg/l to 100 mg/l, in particular 5 mg/l to 90 mg/l, in particular 10 mg/l to 80 mg/l, in particular 15 mg/l to |

| Ingredient | Concentration in a control composition for blood serum samples | Concentration in a control composition for urine samples |
|---|---|---|
|  | 70 mg/l, in particular 20 mg/l to 60 mg/l, in particular 25 mg/l to 50 mg/l, in particular 30 mg/l to 40 mg/l | 70 mg/l, in particular 20 mg/l to 60 mg/l, in particular 25 mg/l to 50 mg/l, in particular 30 mg/l to 40 mg/l |
| A sorbate (in particular potassium sorbate); optional ingredient | 0 mg/l or 0.1 mg/l to 10 mg/l, in particular 0.5 mg/l to 9 mg/l, in particular 1 mg/l to 8 mg/l, in particular 1.5 mg/l to 7 mg/l, in particular 2.0 mg/l to 6 mg/l, in particular 2.5 mg/l to 5 mg/l, in particular 3 mg/l to 4 mg/l | 0 mg/l or 0.1 mg/l to 10 mg/l, in particular 0.5 mg/l to 9 mg/l, in particular 1 mg/l to 8 mg/l, in particular 1.5 mg/l to 7 mg/l, in particular 2.0 mg/l to 6 mg/l, in particular 2.5 mg/l to 5 mg/l, in particular 3 mg/l to 4 mg/l |
| Bromothymol blue (in particular in form of its sodium salt); optional ingredient | 0 mg/l or 1 mg/l to 100 mg/l, in particular 5 mg/l to 90 mg/l, in particular 10 mg/l to 80 mg/l, in particular 15 mg/l to 70 mg/l, in particular 20 mg/l to 60 mg/l, in particular 25 mg/l to 50 mg/l, in particular 30 mg/l to 40 mg/l | 0 mg/l or 1 mg/l to 100 mg/l, in particular 5 mg/l to 90 mg/l, in particular 10 mg/l to 80 mg/l, in particular 15 mg/l to 70 mg/l, in particular 20 mg/l to 60 mg/l, in particular 25 mg/l to 50 mg/l, in particular 30 mg/l to 40 mg/l |
| Bromocresol purple (in particular in form of its sodium salt); optional ingredient | 0 mg/l or 1 mg/l to 100 mg/l, in particular 5 mg/l to 90 mg/l, in particular 10 mg/l to 80 mg/l, in particular 15 mg/l to 70 mg/l, in particular 20 mg/l to 60 mg/l, in particular 25 mg/l to 50 mg/l, in particular 30 mg/l to 40 mg/l | 0 mg/l or 1 mg/l to 100 mg/l, in particular 5 mg/l to 90 mg/l, in particular 10 mg/l to 80 mg/l, in particular 15 mg/l to 70 mg/l, in particular 20 mg/l to 60 mg/l, in particular 25 mg/l to 50 mg/l, in particular 30 mg/l to 40 mg/l |
| A dextran (in particular dextran-40) | 1 g/l to 200 g/l, in particular 5 g/l to 150 g/l, in particular 10 g/l to 125 g/l, in particular 15 g/l to 100 g/l, in particular 20 g/l to 90 g/l, in particular 25 g/l to 80 g/l, in particular 30 g/l to 75 g/l, in particular 40 g/l to 70 g/l, in particular 50 g/l to 60 g/l | none |
| Deuterium oxide | 1% to 20%, in particular 2% to 19%, in particular 3% to 18%, in particular 4% to 17%, in particular 5% to 16%, in particular 6% to 15%, in particular 7% to 14%, in particular 8% to 13%, in particular 9% to 12%, in particular 10% to 11% All percentages are volume per volume (v/v) percentages. | 1% to 20%, in particular 2% to 19%, in particular 3% to 18%, in particular 4% to 17%, in particular 5% to 16%, in particular 6% to 15%, in particular 7% to 14%, in particular 8% to 13%, in particular 9% to 12%, in particular 10% to 11% All percentages are volume per volume (v/v) percentages. |
| Phosphate-buffered saline in water | no specific concentration required; used to provide sufficient volume of buffered solvent and of sodium chloride | none |
| Sodium phosphate buffer | none | 0.05 mM to 1 mM, in particular 0.1 mM to 0.9 mM, in particular 0.2 mM to 0.8 mM, in particular 0.3 mM to 0.7 mM, in particular 0.4 mM to 0.6 mM, in particular 0.5 mM to 0.6 mM |
| Sodium chloride (in addition to any sodium chloride in the used buffer) | none | 0 mM or 1 mM to 500 mM, in particular 5 mM to 400 mM, in particular 10 mM to 300 mM, in particular 15 mM to 250 mM, in particular 20 mM to 200 mM, in particular 50 mM to 175 mM, in particular 75 mM to 150 mM, in particular 100 mM to 130 mM, in particular 110 mM to 120 mM |

All percentages indicated here and in the following are to be understood as weight percent (w/w) or (w/v) for substances being solid at room temperature and as volume percent (v/v) for substances being liquid or gaseous at room temperature, if not explicitly indicated otherwise or evident from the context.

In an embodiment, the control composition comprises the following ingredients in the indicated concentration ranges. In an embodiment, the control composition consists of these ingredients.

| Ingredient | Concentration in a control composition for blood serum samples | Concentration in a control composition for urine samples |
|---|---|---|
| Acetate (in particular sodium acetate) | 5 mM to 20 mM | 5 mM to 20 mM |
| Maleic acid (in particular in form of its sodium salt) | 0.5 mM to 20 mM | 0.5 mM to 20 mM |
| Lactate (in particular sodium lactate) | 0.5 mM to 20 mM | none |
| Trimethylsilylpropanoic acid (TSP) | 0.1 mM to 10 mM | 0.01 mM to 1 mM |
| Pyrazine | 0.05 mM to 5 mM | 0.05 mM to 5 mM |
| 2-propanol | 0.1 mM to 10 mM | 0.1 mM to 10 mM |
| Methanol | 0.1 mM to 10 mM | 0.1 mM to 10 mM |
| Formate (in particular sodium formate) | 0.001 mM to 0.1 mM | 0.01 mM to 1 mM |
| L-histidine | 0.1 mM to 10 mM | 0.1 mM to 10 mM |
| Azide (in particular sodium azide); optional ingredient | 0% or 0.05% to 0.1% The percentages are weight per volume (w/v) percentages. | 0% or 0.05% to 0.1% The percentages are weight per volume (w/v) percentages. |
| A benzoate (in particular sodium benzoate); optional ingredient | 0 mM or 0.1 mM to 10 mM | 0 mM or 0.1 mM to 10 mM |
| A bisulfite (in particular sodium bisulfite); optional ingredient | 0 mg/l or 10 mg/l to 50 mg/l | 0 mg/l or 10 mg/l to 50 mg/l |
| A sorbate (in particular potassium sorbate); optional ingredient | 0 mg/l or 0.5 mg/l to 5 mg/l | 0 mg/l or 0.5 mg/l to 5 mg/l |
| Bromothymol blue (in particular in form of its sodium salt); optional ingredient | 0 mg/l or 10 mg/l to 50 mg/l | 0 mg/l or 10 mg/l to 50 mg/l |
| Bromocresol purple (in particular in form of its sodium salt); optional ingredient | 0 mg/l or 10 mg/l to 50 mg/l | 0 mg/l or 10 mg/l to 50 mg/l |
| A dextran (in particular dextran-40) | 20 g/l to 120 g/l | none |
| Deuterium oxide | 5% to 15% The percentages are volume per volume (v/v) percentages. | 5% to 15% The percentages are volume per volume (v/v) percentages. |
| Phosphate-buffered saline in water | no specific concentration required; used to provide sufficient volume of buffered solvent and of sodium chloride | none |
| Sodium phosphate buffer | none | 0.15 to 0.25M |
| Sodium chloride (in addition to any sodium chloride in the used buffer) | none | 0.05 to 0.2M |

In an embodiment, all substances for which it is indicated that they can be used in form of their sodium salt are used in form of their sodium salt.

A suited composition for the phosphate-buffered saline is 110 to 150 mM, in particular around 137 mM sodium chloride, 1 to 5 mM, in particular around 2.7 mM potassium chloride, and 1 to 25, in particular 5 to 15, in particular around 12 mM total phosphate. It typically exhibits a pH value of around 7.4.

Embodiments of the explained method can be transferred in any desired way and combination to the explained control composition, and vice versa.

DESCRIPTION OF THE INVENTION

Exemplary Embodiment: Control Composition for Blood Serum Samples

A particularly suited control composition for serum samples consists of 10 mM acetate (as sodium salt), 4 mM maleic acid (as sodium salt), 2 mM L(+)-lactate (as sodium salt), 2 mM trimethylsilylpropanoic acid (TSP), 0.2 mM pyrazine, 1 mM [±0.5 mM] 2-propanol, 1 mM methanol, 0.01 mM formate (as sodium salt), 1 mM L-histidine, 0.01% sodium azide, 25 mg/l bromothymol blue (as sodium salt), 72 g/l dextran-40, 10% deuterium oxide, as well as phosphate-buffered saline dissolved in water.

The combination of phosphate-buffered saline and dextran-40 results in a matrix being highly similar (to more than 80%) to blood serum regarding osmotic concentration and viscosity as relevant physical properties.

If this control composition is measured on an NMR spectrometer, the resulting NMR spectrum is a result space ranging from 0 ppm (NMR signal of TSP) to 8.7 ppm (NMR signal of pyrazine) and representing proton signals of proton concentrations differing by three orders of magnitude. Thus, the spectrum covers the total spectral range that is also used for subsequent measurements of blood serum samples. In addition, the proton concentrations of the substances in the control composition cover the whole concentration range that is expected to be detected in blood serum samples subsequently to be measured.

The NMR lines observed in this spectrum are then evaluated as to whether or not they comply with predefined expectation values.

The low-concentrated sodium formate serves for detecting a minimum sensitivity of the tested NMR spectrometer.

For obtaining a trueness value of the tested NMR spectrometer, the determined concentration (based on the intensity of the NMR signal) of acetate can be compared with the expectation value of 10 mM.

In order to determine the spectrometer frequency, the distance between the individual peaks of the NMR signal of 2-propanol is evaluated.

The NMR signals of methanol and TSP are located on a first side of the water signal, namely at lower chemical shifts, i.e. on the right side of the water signal if the spectrum is represented from higher chemical shifts on the left to lower chemical shifts on the right, like it is usually done.

The NMR signals of maleic acid and pyrazine are located on a second side of the water signal, namely at higher chemical shifts, i.e. on the left side of the water signal if the spectrum is represented from higher chemical shifts on the left to lower chemical shifts on the right, like it is usually done.

The NMR signal of maleic acid is particularly suited to be used for checking the compliance of signal position, line width and signal form with according predefined expectation values.

Exemplary Embodiment: Control Composition for Urine Samples

A particularly suited control composition for urine samples consists of:
  10 mM acetate (as sodium salt) [±1 mM]
  4 mM sodium maleate [±0.4 mM]
  0.1 mM TSP [±0.01 mM]
  0.2 mM pyrazine [±0.02 mM]
  1 mM 2-Propanol [±0.5 mM]
  1 mM methanol [±0.1 mM]
  0.1 mM formate (as sodium salt) [±0.01 mM]
  0.9 mM L-histidine [±0.1 mM]
  0.01% sodium azide [(w/v), ±0.001%]
  0.2 mM sodium benzoate [±0.02 mM]
  50 mg/l sodium bisulfite [±0.5 mg/l]
  1 g/l potassium sorbate [±0.1 g/l]
  25 mg/l bromocresol purple [±10 mg/l]
  120 mM sodium chloride NaCl [±12 mM]
  ~0.2M sodium phosphate buffer (stock pH 7.4)
  10% deuterium oxide [v/v, ±1%]
  water (ACS, p.a.) as a solvent The combination of a sodium phosphate buffer supplemented by sodium chloride results in a matrix being highly similar (to more than 80%) to urine regarding osmotic concentration and viscosity as relevant physical properties.

Thereby, it is not necessary to add urea to the matrix like one would expect when preparing a matrix for urine samples. Rather, the control composition for urine samples is free of urea. The omission of urea is particularly favorable with respect to the stability of other substances in the control composition.

If this control composition is measured on an NMR spectrometer, the resulting NMR spectrum is a result space ranging from 0 ppm (NMR signal of TSP) to 8.7 ppm (NMR signal of pyrazine) and representing proton signals of proton concentrations differing by three orders of magnitude. Thus, the spectrum covers the total spectral range that is also used for subsequent measurements of urine samples. In addition, the proton concentrations of the substances in the control composition cover the whole concentration range that is expected to be detected in urine samples subsequently to be measured.

The NMR lines observed in this spectrum are then evaluated as to whether or not they comply with predefined expectation values.

The low-concentrated sodium formate serves for detecting a minimum sensitivity of the tested NMR spectrometer.

For obtaining a trueness value of the tested NMR spectrometer, the determined concentration (based on the intensity of the NMR signal) of acetate can be compared with the expectation value of 10 mM.

In order to determine the spectrometer frequency, the distance between the individual peaks of the NMR signal of 2-propanol is evaluated.

The NMR signals of methanol and TSP are located on a first side of the water signal, namely at lower chemical shifts, i.e. on the right side of the water signal if the spectrum is represented from higher chemical shifts on the left to lower chemical shifts on the right, like it is usually done.

The NMR signals of maleic acid (i.e. sodium maleate) and pyrazine are located on a second side of the water signal, namely at higher chemical shifts, i.e. on the left side of the water signal if the spectrum is represented from higher chemical shifts on the left to lower chemical shifts on the right, like it is usually done.

The NMR signal of maleic acid is particularly suited to be used for checking the compliance of signal position, line width and signal form with according predefined expectation values.

The invention claimed is:

1. A method for determining proper functioning of an analytic system comprising an NMR spectrometer, a mass spectrometer, or a chromatographic system, the method comprising:
  a) measuring a control composition with an analytic system, the functioning of which is to be determined, to obtain a control result,
  b) analyzing the control result for at least one predefined test criterion to determine its conformity with this predefined test criterion, and
  c) determining the functioning of the analytic system based on the analysis of step b),
  wherein the control result comprises signals distributed over a result space that equals a whole result space of the analytic system resulting from a measurement of a sample on the analytic system.

2. The method according to claim 1, wherein the control result comprises at least two result space sections being distinct from each other, wherein the control result exhibits at least one signal per result space section.

3. The method according to claim 2, wherein at least one of the result space sections is located on a first result space side of at least one solvent signal and that the remaining result space sections are located on a second result space side of the same solvent signal.

4. The method according to claim 3, wherein at least one of the result space sections is located such that it does not encompass any solvent signals.

5. The method according to claim 2, wherein at least one of the result space sections is located such that it does not encompass any solvent signals.

6. The method according to claim 2, wherein the predefined test criterion is chosen from the group consisting of signal position, signal form, signal width, signal intensity, signal integral, and distance to another signal.

7. The method according to claim 1, wherein the predefined test criterion is chosen from the group consisting of signal position, signal form, signal width, signal intensity, signal integral, and distance to another signal.

8. The method according to claim 1, wherein the control composition comprises a matrix and control substances dissolved in the matrix, the matrix being chosen such that it resembles a sample to be measured on the analytic system to an extent of at least 80% with respect to its overall physical properties.

9. The method according to claim 8, wherein the physical matrix properties are defined by at least one of the properties chosen from the group consisting of viscosity, conductivity, osmotic concentration, ionic strength, maximum concentration of individual matrix constituents, and distribution of result space signals of individual matrix constituents.

10. The method according to claim 1, wherein step b) is performed by at least one of the following: b1) checking general spectral quality by analyzing at least one signal quality criterion chosen from the group consisting of signal position, signal form, signal width, signal intensity, signal integral, and distance to another signal, b2) checking the linearity of the result space by evaluating signals of defined test substances regarding deviations of measured signal intensities and/or signal integrals and/or parameters derived therefrom from known target signal intensities and/or target signal integrals and/or parameters derived therefrom, and b3) quantifying selected signals and comparing the result of quantification with a known target value.

11. The method according to claim 10, wherein in any of b1), b2), and b3) a threshold of maximum deviation from an expectancy value is defined that must not be exceeded in order to successfully pass the respective b1), b2), and b3).

12. The method according to claim 1, wherein the method comprises determining whether a predefined minimum sensitivity value of the analytic system is achieved by detecting a signal of a low-concentrated constituent of the control composition.

13. The method according to claim 1, wherein the control result comprises at least two result space sections being distinct from each other, wherein the control result exhibits at least one signal per result space section.

14. The method according to claim 1, wherein the predefined test criterion is chosen from the group consisting of signal position, signal form, signal width, signal intensity, signal integral, and distance to another signal.

15. A control composition for carrying out a method comprising:
   a) measuring a control composition with an analytic system, the functioning of which is to be determined, to obtain a control result,
   b) analyzing the control result for at least one predefined test criterion to determine its conformity with this predefined test criterion, and
   c) determining the functioning of the analytic system based on the analysis of step b),
      wherein the control result comprises signals distributed over a result space that equals a whole result space of the analytic system resulting from a measurement of a sample on the analytic system,
      wherein the control composition comprises a matrix and control substances dissolved in the matrix,
      wherein the matrix comprises sodium chloride, $D_2O$, a buffering agent, and a preservative agent.

16. The control composition according to claim 15, wherein the matrix additionally comprises at least one further substance chosen from the group consisting of urea, a bisulfite, a sorbate, and a coloring agent.

17. The control composition according to claim 15, wherein the control substances are chosen from the group consisting of an acetate, a citrate, sucrose, methanol, maleic acid, propanol, a formate, ethylene glycol, a pyrazine, trimethylsilylpropanoic acid, and histidine.

18. The control composition according to claim 17, wherein the control substances comprise an acetate, methanol, maleic acid, propanol, a formate, a pyrazine, trimethylsilylpropanoic acid, and histidine.

19. The control composition according to claim 15, wherein the control composition comprises dextran-40.

20. The control composition according to claim 15, wherein the matrix further comprises a dextran.

* * * * *